United States Patent [19]
Behan et al.

[11] Patent Number: 5,768,699
[45] Date of Patent: Jun. 16, 1998

[54] AMPLIFIER WITH DETUNED TEST SIGNAL CANCELLATION FOR IMPROVED WIDE-BAND FREQUENCY RESPONSE

[75] Inventors: Scott T. Behan, Oxnard; Daniel L. Gerlach, Thousand Oaks; Benoni Achiriloaie, Camarillo, all of Calif.

[73] Assignee: AML Communications, Inc., Camarillo, Calif.

[21] Appl. No.: 545,987

[22] Filed: Oct. 20, 1995

[51] Int. Cl.⁶ ................................................. H04B 1/10
[52] U.S. Cl. ..................... 455/296; 455/126; 455/235.1; 330/151; 332/162
[58] Field of Search ..................... 455/126, 232.1, 455/233.1, 234.1, 234.2, 235.1, 237.1, 295, 296, 114, 115, 240.1, 241.1, 245.2, 246.1, 253.2; 330/149, 151, 52; 332/159, 162

[56] References Cited

U.S. PATENT DOCUMENTS

| | | | |
|---|---|---|---|
| 3,815,040 | 6/1974 | Seidel | 330/149 |
| 5,323,119 | 6/1994 | Powell et al. | 330/151 |
| 5,508,657 | 4/1996 | Behan | 330/151 |
| 5,576,659 | 11/1996 | Kenington et al. | 330/151 |

FOREIGN PATENT DOCUMENTS

| | | | |
|---|---|---|---|
| 1302605 | 1/1973 | United Kingdom | 330/151 |
| 2167256 | 5/1986 | United Kingdom | 330/151 |

*Primary Examiner*—Reinhard J. Eisenzopf
*Assistant Examiner*—Doris To
*Attorney, Agent, or Firm*—Gene W. Arant; Christopher R. Balzan

[57] ABSTRACT

A feed forward amplifier circuit which includes a main amplifier, an error correction circuit producing a message error signal, an error amplifier for producing an amplified message error signal that is then subtracted from the amplified and distorted message signal output of the main amplifier prior to a final output circuit, a negative feedback circuit coupled to the final output circuit responsive to a test signal for compensating and minimizing drift in the operation of the error amplifier, and circuitry associated with the negative feedback circuit for detuning performance of the error correction circuit at the test frequency so as to improve the overall circuit performance across a desired operating frequency band while diminishing its performance at the test signal frequency.

35 Claims, 7 Drawing Sheets

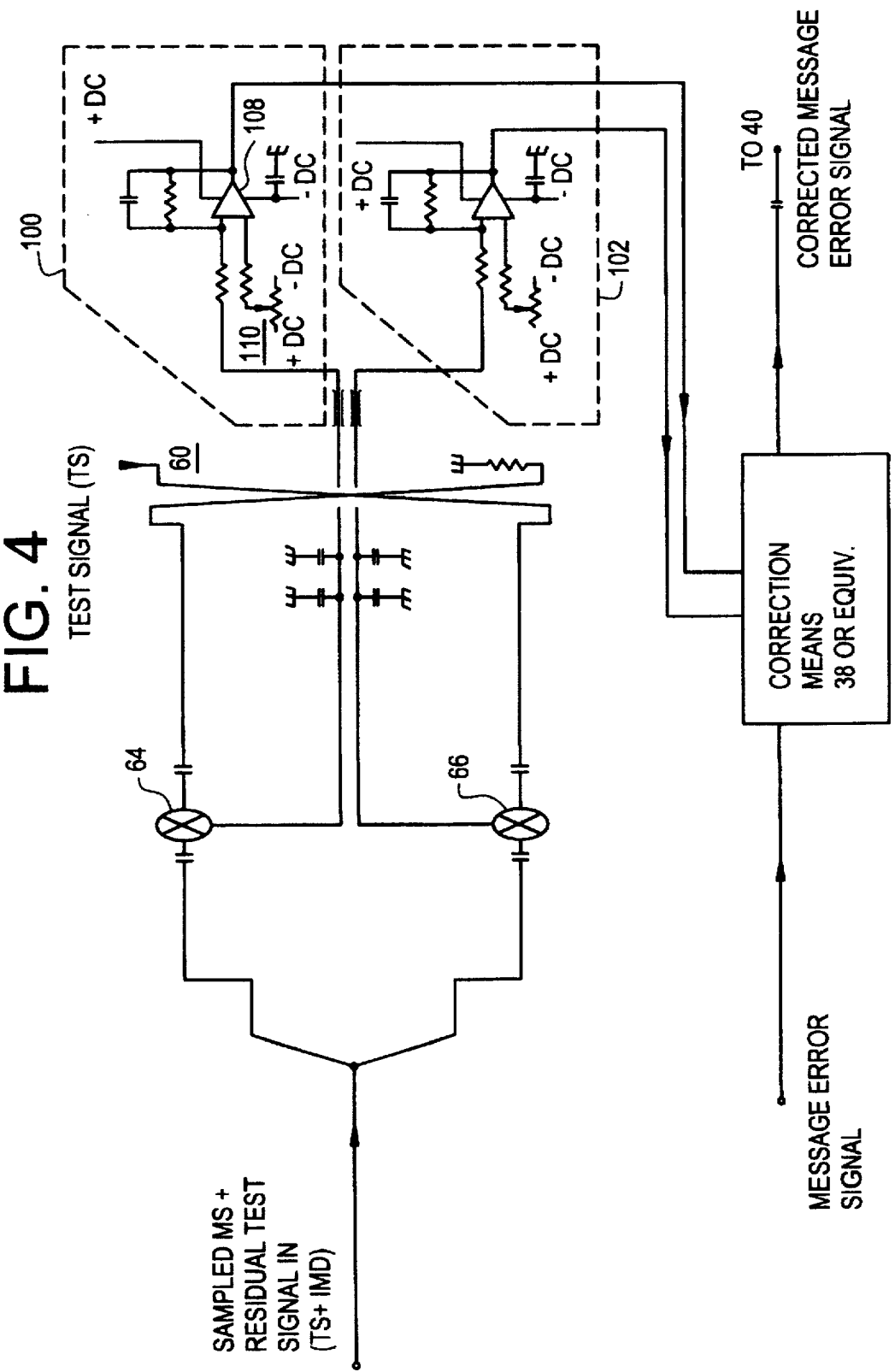

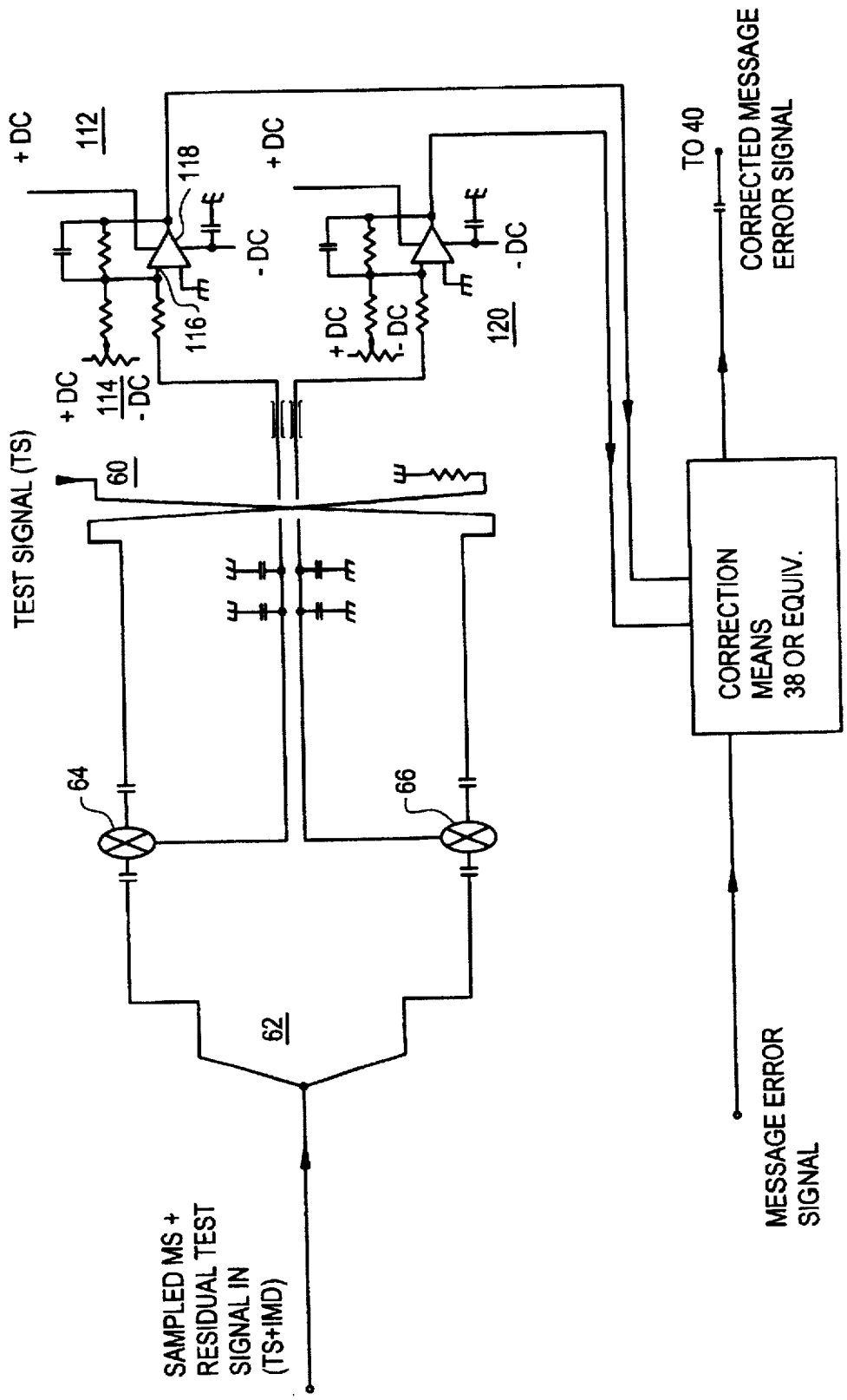

AMPLIFIER WITH DETUNED TEST SIGNAL CANCELLATION FOR IMPROVED WIDE-BAND FREQUENCY RESPONSE

BACKGROUND OF THE INVENTION

In modern communication circuits there is a need for efficient, high fidelity amplification of information signals occupying wide frequency bands. The information may require processing in analog form, in digital form, or in some combination or variation thereof. At the same time, it is important to maintain high fidelity throughout the operating frequency band.

In modern cellular telephone systems the base station or repeater amplifiers may be required to amplify signals occupying a bandwidth that is in the range of five per cent to ten percent of an underlying carrier frequency. Personal Communication System (PCS) equipment may well require bandwidths in excess of fifteen per cent of an underlying carrier frequency. Consistent, reliable, high fidelity amplification throughout such a frequency band is inherently difficult to achieve.

Furthermore, as is well known, the performance of amplifiers and other comparable communication circuits will drift as a function of power supply voltage, temperature changes, time, and other environmental factors. The typical reason for such a drift in performance is that the actual or effective values of some of the circuit components change. It is therefore a well known expedient to provide such circuitry with adaptive controls that respond to changing circuit conditions so as to maintain circuit performance at as near a constant level as possible.

The use of test signals for adaptive control is well known. A test signal may be generated at a known frequency and supplied to the equipment for the express purpose of having some residual part of it provide a standard from which drifts in circuit performance can be identified. The residual portion of the test signal is then considered to be a measure of the signal distortion occurring within the circuitry. A conventional approach is then to include circuit means that will accomplish maximum cancellation of the observed residual test signal. Thus, the technique may be described as cancelling a distortion frequency component in order to improve circuit performance.

SUMMARY OF THE INVENTION

According to the invention it has been observed that when high fidelity response over a wide frequency band is desired, the complete cancellation of a test or distortion signal may not be the best approach. In fact, it has been determined, empirically to some extent, that it is advantageous to deliberately detune the cancellation of the test or distortion signal so that fidelity of circuit response over a wide frequency band may be improved.

More specifically, according to the invention the cancellation of a test or distortion signal at a known frequency is deliberately detuned so that the circuit performance will be somewhat less desirable for that particular frequency, but will be improved across the desired frequency band as a whole. The optimum magnitude of the detuning is determined either by direct measurement or in some other appropriate manner.

While the test or distortion signal may often be at a frequency that lies within the desired operating frequency band of the equipment, in other instances it is also known to utilize a test signal that lies outside the operating frequency band. In such a situation the cancellation of the test or distortion signal is deliberately detuned so that the circuit performance will be optimum across the desired frequency band as a whole.

DRAWING SUMMARY

FIG. 4 is a schematic circuit diagram showing bandwidth compensators providing D. C. offset signals to the quadrature control signals that are then used to control the quadrature vector error signals;

FIG. 5 is a schematic circuit diagram showing an alternative location in the circuit for applying the D. C. offset signals;

Figure 6A:
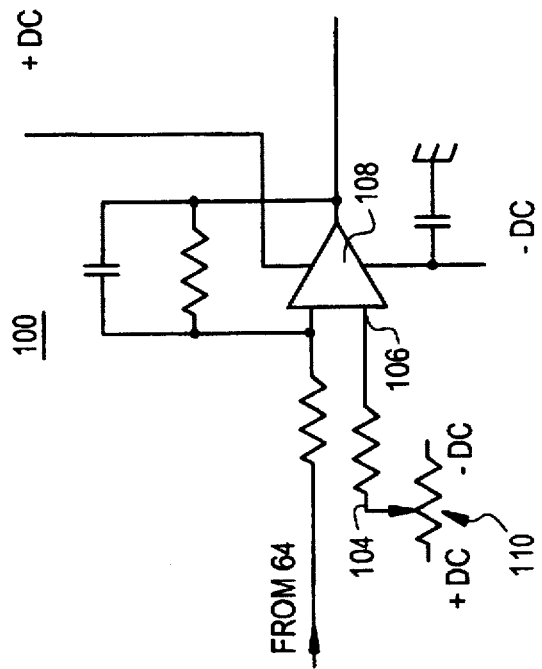
Figure 6B:
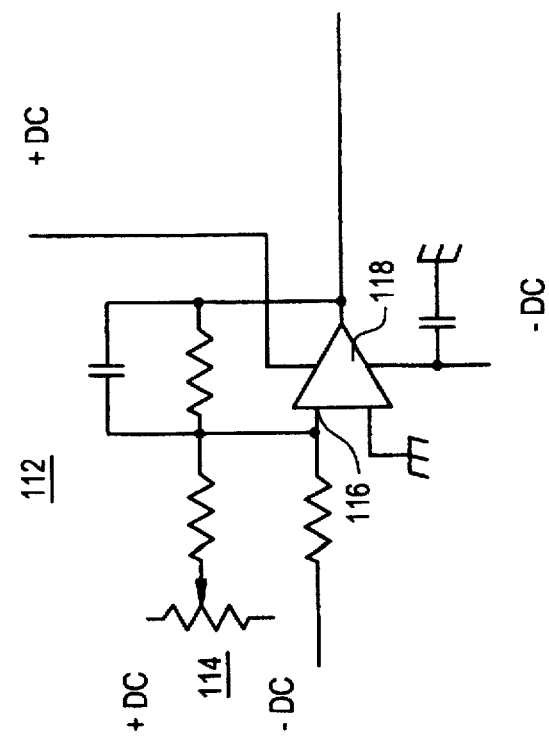
Figure 7:
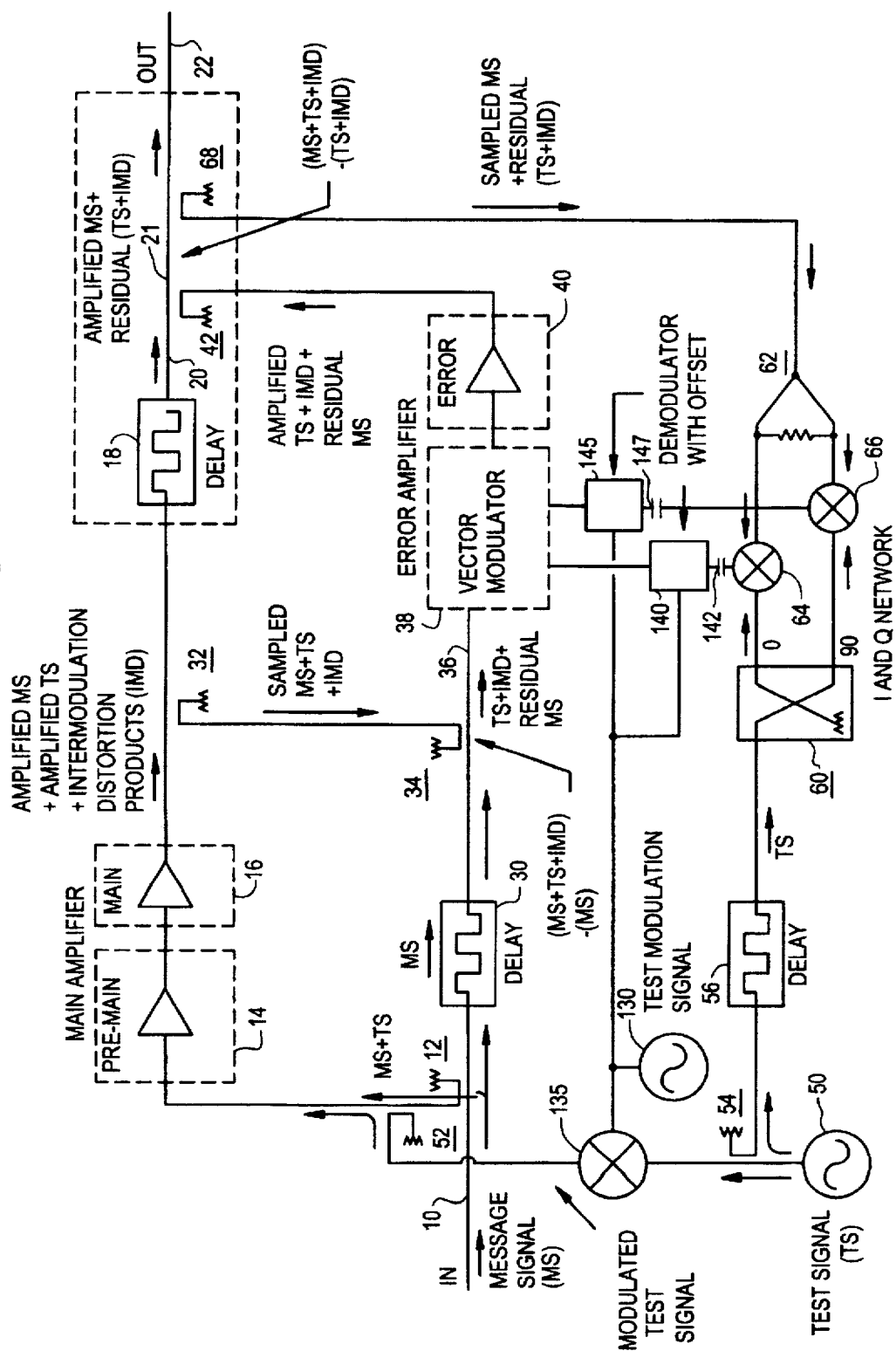

FIGS. 6 (a) and 6 (b), respectively, are enlargements of the D. C. offset circuits of FIG. 5 and FIG. 4, respectively; and FIG. 7 is a schematic circuit diagram showing bandwidth compensators used in conjunction with the demodulators of a modulation signal that is superimposed on the test signal, for providing D. C. offset signals to the quadrature control signals that are then used to control the quadrature vector error signals.

DETAILED DESCRIPTION OF PREFERRED EMBODIMENT (FIGS. 1–4)

General Description

In general, the amplifier system of the present invention incorporates the circuitry shown in the copending and allowed application of Scott T. Behan, Ser. No. 08/380,042 filed Jan. 30, 1995 for: FEED FORWARD CANCELLATION AMPLIFIER UTILIZING DYNAMIC VECTOR CONTROL, and assigned to the same assignee as the present application; now U.S. Pat. No. 5,508,657.

The system includes a main amplifier, an error correction circuit containing an error amplifier for producing an amplified message error signal that is then subtracted from the amplified and distorted message signal output of the main amplifier in a near-final output circuit, and negative feedback circuit for compensating and minimizing variation and drift in the operation of the error amplifier is also provided. As presently illustrated, a vector modulator is one component of the negative feedback circuit.

The negative feedback circuit is coupled to a final output circuit, includes circuit means for comparing a test signal with a residual portion of the same test signal that is derived from the final output circuit, and in response thereto produces quadrature control signals. Bandwidth compensation means is provided in the form of circuit means associated with the negative feedback circuit for offsetting the DC levels of the quadrature control signals so as to detune performance of the error correction circuit at the test frequency. The offset quadrature control signals in turn dynamically and independently control the amplitudes of the quadrature vector components of the error signal so as to compensate and minimize variation or drift in the operation of the amplifier circuit, and hence improve its overall performance across a desired operating frequency band.

Figure 1:
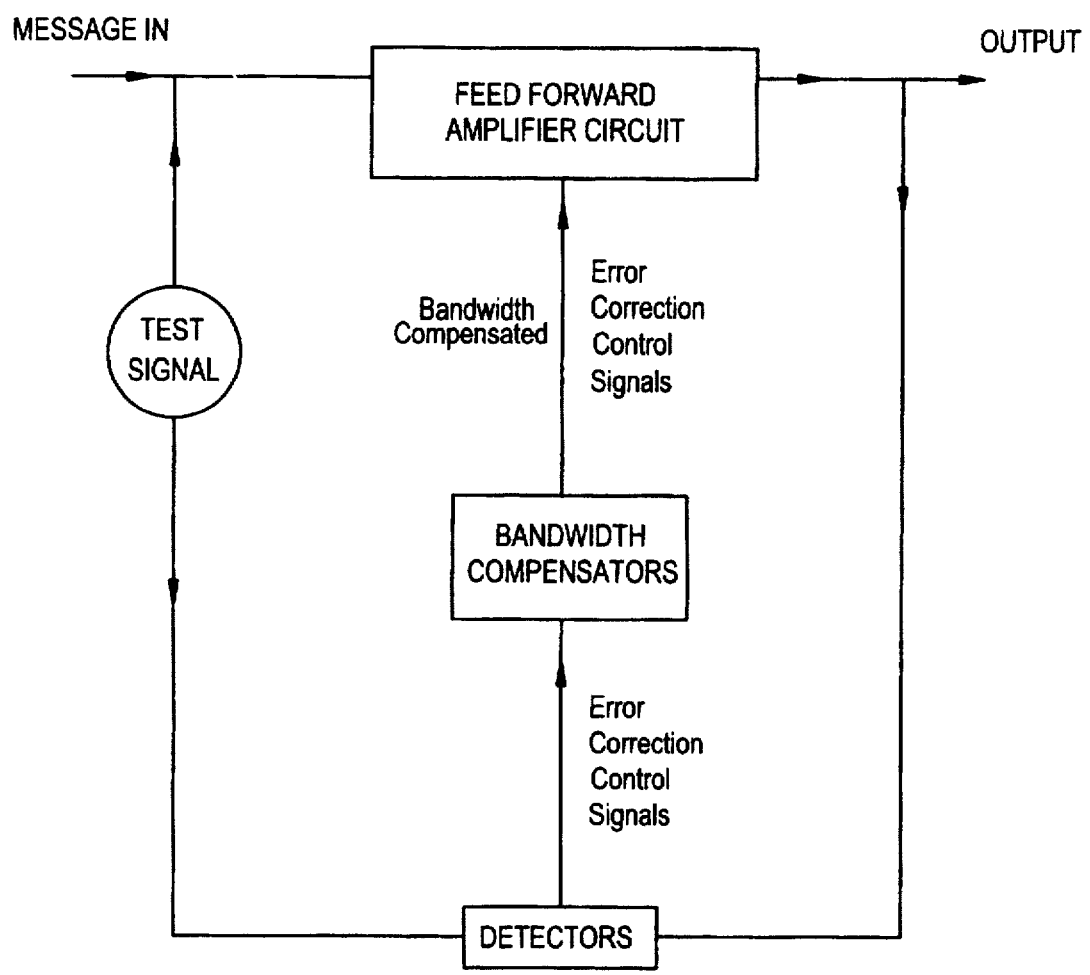
FIG. 1 is a schematic block diagram of our new amplifier system showing the location of bandwidth compensators in the system for detuning test signal cancellation to improve wide-band frequency response.
Figure 2:
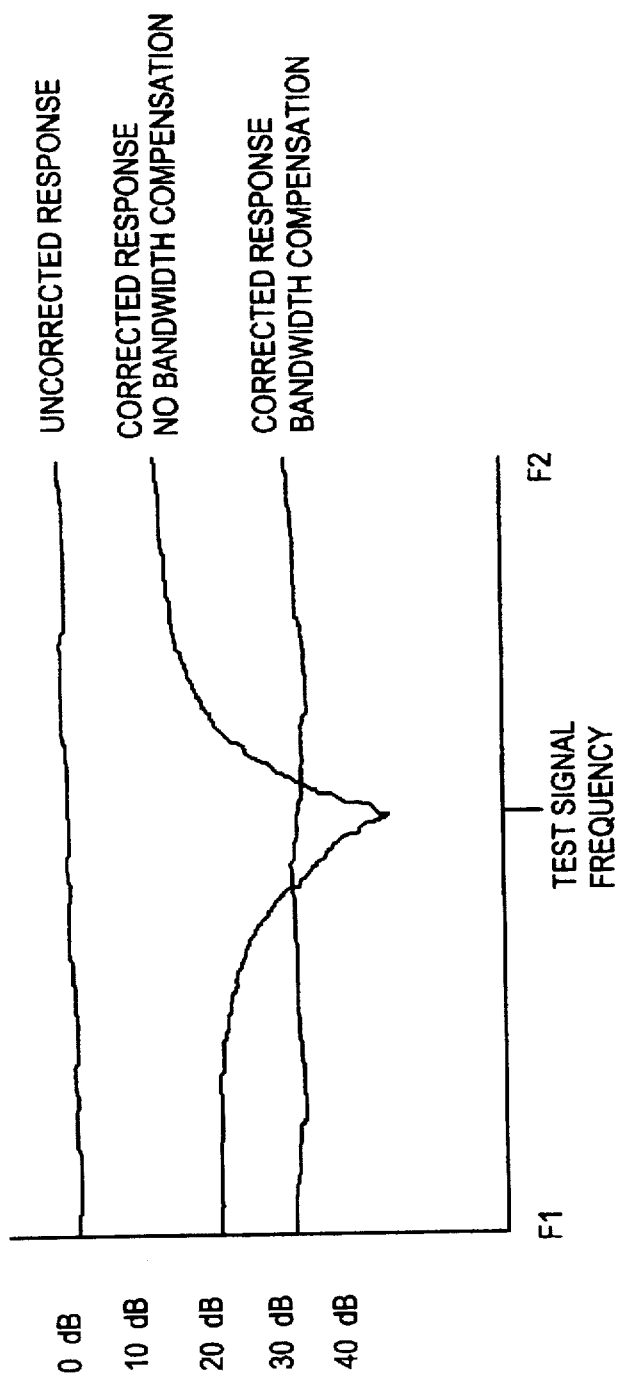
FIG. 2 is an illustration of hypothetical amplifier frequency response with and without conventional adaptive control, and our amplifier with our novel circuit modification for detuning the test signal cancellation so as to extend the useful frequency bandwidth.
Figure 3:
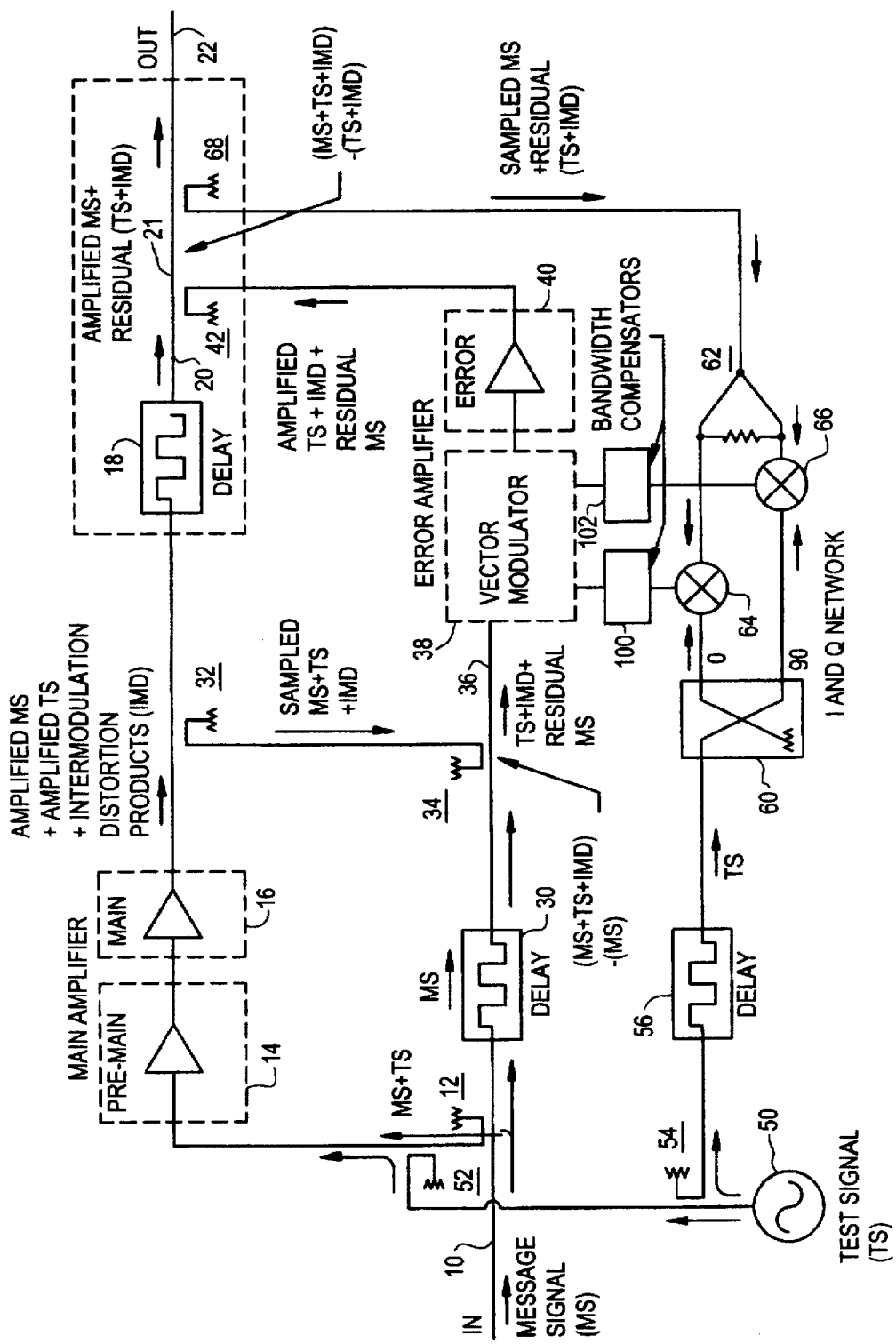
FIG. 3 is a schematic system diagram of our improved amplifier system, primarily in one-line block form, showing the bandwidth compensators for modifying quadrature control signals applied to a vector modulator.

FIG. 1 being purely schematic is deemed self-explanatory and should require no further detailed description. Actual circuitry is shown in FIGS. 3 and 4. FIG. 2 illustrates the bandwidth response of the amplifier system, and more particularly, the effect of the bandwidth compensation method of the present invention.

Refering now to FIGS. 2 and 3, the system will be described in more detail.

The main amplifier circuit includes a message signal input 10 to which a message signal is applied, the signal typically being a group of radio frequency telephony signals that are to be processed concurrently. The input message signal MS applied to message input 10 passes through a coupling 12 to a pre-amplifier stage 14 and a main amplifier stage 16 of a radio frequency high power amplifier operating in Class A B. A power amplifier is utilized that operates at high energy efficiency but with measurable signal distortion. The message signal is then amplified by the RF power amplifier 14, 16, resulting in an amplified and distorted version of the input message signal which includes error introduced during the amplification process. In the common situation where multiple frequencies are being processed at the same time, the distortion or message signal error IMD is typically due to cross-modulation of the different frequency signals as a result of nonlinearity of circuit operation. The amplified and distorted message signal then passes through a time delay element 18 and to message signal output 20. From message signal output 20 the amplified and distorted message signal passes through a combiner 42 where an amplified message error signal of substantially equal amplitude and substantially opposite phase, is added to it. The combined signal which appears at the near-final output 21 then constitutes a corrected near-final output signal.

The error detection circuit loop compares input and output of the RF power amplifier 14, 16, to create a message error signal indicative of the errors and distortion occurring in the main amplifier. The input message signal, with some attenuation at 12, passes through a delay device 30 before reaching a summing device 34. A sample of the amplified and distorted message signal is taken from the output of the power amplifier 14, 16, also with some attenuation, through a coupler 32 and also applied to the summing device 34 where it is combined with the sample of the input message signal. The purpose of the time delay element 30 is to compensate for the signal transit time through the RF power amplifier path and the associated path leading to summing device 34. The signals are combined in the summing device 34 in such a way that the sample of the amplified and distorted message signal, and the sample of the input message signal, are of substantially equal amplitudes, but substantially opposite in phase, resulting in a destructive interference which significantly reduces the level of the message signal at the output of the combiner 34, but leaving the message error signal present at location 36 as shown in FIG. 3.

The message error signal passes from the summing device 34 along signal line 36 through a control network including vector modulator 38 to a Class A radio frequency amplifier 40 where the message error signal is amplified with minimal generation of additional distortion. For proper operation of the feed forward cancellation amplifier system, the error amplification circuit needs to produce an amplified message error signal at the output of amplifier 40 that may then be subtracted from the time-delayed amplified and distorted message signal at 42 so as to destroy the errors. In order to achieve that result the amplified message error signal must have the appropriate amplitude, phase, and time delay relative to the time-delayed amplified and distorted message signal with which it is to be combined.

The vector modulator 38 operates by attenuating the two orthogonal components of the message error signal received at 36, which are then combined into a single vector. It would be possible to operate the vector modulator 38 by setting fixed parameters for attenuation of the two orthogonal components of the message error signal, but such a static method of control would not fully compensate dynamic operation of the feed forward cancellation amplifier. The control of vector modulator 38 is accomplished dynamically, as described in later paragraphs.

The above described vector modulator operates over a single quadrant of a four quadrant system. Each of the component vectors can only be modified in amplitude, there being no provision to change the polarity of the amplitude, or to provide a vector of similar amplitude variation but opposite in phase. This requires the performance of the system to be set to have its nominal performance in the middle of the quadrant of operation. It is significant that the impedance of the vector modulator can be closely matched with its load impedance over a substantial signal dynamic range thus producing a very small voltage standing wave ratio (VSWR).

The Vector Modulator Control signals are directly derived from an I and Q network so that there is no signal translation required. The I and Q vector modulator provides Wide band performance and maintains good VSWRs (Voltage Standing Wave Ratios) over a high dynamic range. An alternative arrangement of a vector modulator circuit can provide continuous four quadrant vectorial correction.

The amplified message error signal or distortion connection signal proceeds from error amplifier 40 to a coupler 42 where it is coupled to the output path 20 of the delay device 18, and is combined with the time-delayed amplified and distorted message signal but in opposite phase relation. The combined signal constitutes a corrected near-final output signal which appears at near-final output 21.

The amplitude of the message error signal flowing through the error signal amplification path 32, 34, 36, 38, 40, 42, is adjusted at amplifier 40 such that it is substantially equal to the amplitude of the message error signal contained in the time-delayed amplified and distorted message signal received from the delay device 18. The time delay through device 18 as it appears at 20 is selected to compensate for signal transit time through the error signal amplification path 32, 34, 36, 38, 40, 42. The phase of the error signal path is set such that it is substantially opposite that of the time delayed path 32, 18, 20, with the result that the message error signals combine in the coupler 42, destructively interfering with and significantly reducing the level of the message error signal present at the near-final output 21 of the amplifier system.

Thus the error detection circuit loop in conjunction with the error amplification circuit provides an amplified message error signal that is then subtracted from the time-delayed amplified and distorted message signal output of delay device 18 so as to substantially destroy the message signal errors occurring in the RF power amplifier.

NEGATIVE FEEDBACK CIRCUIT—APPLYING A TEST SIGNAL TO THE MESSAGE SIGNAL PATH

The general theory of operation of a negative feedback circuit utilizing a test signal and test signal detection circuit loop is described in an article entitled "A Microwave Feed-Forward Experiment", by H. Seidel, published in The Bell System Technical Journal, Vol. 50, No. 9, November, 1971.

A test signal generator 50 generates a test signal TS both to measure the performance of the error detection circuit loop and error amplification circuit, and to compensate for any variation or drift in that performance. Where the amplifier system is adapted to operate over two separate frequency bands, as is typical in cellular telephone circuitry, and the particular equipment operates in only one of the bands, it is advantageous to select a test signal frequency that lies in the other band not currently being used for the message signal. That choice avoids any significant interaction of the test signal with the message signal. However, the test signal may also be selected to lie within the operating band of frequencies, since it will be detected at the final output by an appropriate frequency selection circuit.

The test signal TS is applied through a coupler 52 to the RF power amplifier input and hence passes all the way through the main amplifier path of the feed forward cancellation amplifier. From coupler 52 it passes to the input of pre-amplifier 14, and passes through circuit elements 16, 18, 20, 42, 21, and 68 to the final output 22. It will thus be noted that the test signal is operated upon in the message signal circuit similarly to the message signal itself, but not in the same way because no time-delayed version of the test signal TS is presented to the combiner 34. The combiner 34, therefore, permits whatever proportion of the test signal TS and the amplified and distorted message signal (MS+IMD) was sensed at the coupler 32 to pass into the error amplification circuit. The combiner 34 is not a perfect device and hence there is some loss of signal amplitude of both the message signal error and the test signal in passing through it. In other words, the coupler 52 provides a means for combining the test signal with the message signal to provide a composite original signal. This composite original signal passes to the input of the RF power amplifier 14, 16 resulting in an amplified and distorted version of the composite signal. The coupler 32 provides a means for sampling the output of RF power amplifier 14, 16. The combiner 34 provides a first comparison means for comparing the sampled output of RF power amplifier 14, 16 with the delayed message signal.

The test signal detection circuit loop through coupler 68 operates to detect the presence of the test signal, if any, in the corrected near-final output signal. The test signal TS provided by the test signal generator 50 is also applied through a coupler 54 and a delay device 56 to an I & Q network 60, 64, 66, 62. Prior to the final output 22, where the time-delayed amplified and distorted message signal has been corrected by subtracting the message error signal, the corrected near-final output signal is sampled through coupler 68, and that signal sample is provided to a signal splitter 62 forming part of the I & Q network. Although coupler 68 is a broad frequency band device, the operation of the I & Q network is such as to derive control signals only from the signals received at the test signal frequency.

Hypothetically, it would be possible to have zero amplitude of the test signal TS appearing at the final output 22.

That could happen if the amplitude of the test signal as delivered through combiner 42 were exactly equal to that of the test signal passing through delay device 18, and the phase relationship of those same two signals were exactly opposite, resulting in complete cancellation. Therefore, the purpose of coupler 68 and the associated test signal detection circuit loop is to determine whether any amplitude of the test signal exists at near-final output 21, immediately prior to the coupler 68. If a measurable test signal output is present there, that indicates that the circuit loop 32, 34, 36, 38, 40, 42, 18, 20, is not operating with absolute perfection. The corrected final output signal at 22 will differ from the near-final output signal only in a reduction in signal amplitude due to the signal picked off at 68.

The negative feedback compensating circuit involves maintaining the amplified message error signal at appropriate amplitude and phase levels such that optimum message signal error cancellation is obtained. Because the error amplifier transfer function will vary with time and temperature, and due to the tight phase and gain restrictions required to maintain substantial message signal error cancellation at the near-final output, a method of correction is implemented to monitor and correct for deviations in error amplifier performance. This correction network is known as a vector modulator. Vector modulator 38 operates on orthogonal or complex components of the message error signal received on line 36. It is in turn controlled by orthogonal voltage signals developed in the I & Q network. The vector modulator 38 includes a 90 degree quadrature hybrid circuit having two outputs, a first electronically variable signal attenuator connected to one of its outputs, and a second electronically variable signal attenuator connected to its other output. The outputs of the two attenuators are combined by a power combiner, whose output is therefore a vector error signal. That vector error signal is fed through a pre-amplifier to the input of error amplifier 40. From the output of error amplifier 40, therefore, an amplified vector error signal or modified message error signal is supplied to the coupler 42.

Only amplitude is used to modify vector information of the message error signal. The vector modulator 38 derives the orthogonal components of the message error signal from the path 36, at phase angles of +45 degrees and −45 degrees, and operates to modify the amplitude of one or both orthogonal components in one quadrant prior to combining the modified orthogonal component vectors to provide a modified vector error signal. Modification of the amplitude of each orthogonal component of the message error signal is achieved by varying a voltage that is applied to its associated electronically variable signal attenuator. The vector modulator 38 and error amplifier 40 provide a means responsive to the first comparison 34 for creating the amplified message error signal or error signal supplied to the coupler 42. The coupler 42 provides a means for combining the error signal with the distorted composite signal to provide an essentially undistorted message signal at 21.

The I & Q network includes a quadrature hybrid circuit 60 which responds to the test signal TS to produce two signals in phase quadrature, at +45 degrees and −45 degrees, each with an amplitude of nominally 70.7% of the input test signal. Those phase quadrature signals are applied to mixer or multiplier circuits 64 and 66, respectively, as Local Oscillator (LO) signals. The I & Q network also includes a power divider 62 which divides the sampled near final output signal into two equal phase, equal amplitude signals which are also applied to mixer circuits 64 and 66.

The desired output signals of these mixers is the D.C. voltage component due to the mixing (multiplying) of the LO signals with the test signal component of the near-final output sampled at (68). Higher frequency mixer output signal components produced by the mixing of other than test frequency signals with the LO signals are substantially reduced in amplitude by low pass filters at the mixer outputs. Because of the 90 degree difference between the LO signals entering the mixer, the D.C. output of each mixer is at least somewhat linearly related to the amplitude of the quadrature components of the sampled test signal present at 68.

Each mixer output is preferably applied to an operational amplifier. The difference between each mixer output and its reference is amplified to produce a control voltage. These quadrature control voltages are applied to the corresponding attenuators of the quadrature components of the message error signal.

Thus the residual test signal derived from the signal sample at 68 is applied to signal splitter 62 which drives mixers 64 and 66. The test signal TS derived from test oscillator 50 through the delay device 56 is applied to the quadrature hybrid circuit 60 which responds to the test signal TS to produce two phase quadrature signals that are also applied to mixer or multiplier circuits 64 and 66, respectively, as Local Oscillator (LO) signals. The output of mixers 64 and 64 pass through corresponding low pass filters to provide the quadrature control signal inputs to the vector modulator circuit or its equivalent. In other words, the I & Q network 60, 64, 66, 62, provides a second comparison step for comparing the corrected near-final output signal or essentially undistorted message signal with the test signal to produce the control signals or correction signal for modifying the error signal.

THE BANDWIDTH COMPENSATORS

According to the present invention the residual test signal derived from the signal sample at 68 is applied to signal splitter 62 which drives mixers 64 and 66. The test signal TS derived from test oscillator 50 through the delay device 56 is applied to the quadrature hybrid circuit 60 which responds to the test signal TS to produce two phase quadrature signals that are also applied to mixer or multiplier circuits 64 and 66, respectively, as Local Oscillator (LO) signals. The output of mixer 64 passes through a low pass filter to provide one control signal input to the vector modulator circuit, and similarly, the output of mixer 66 passes through a low pass filter to provide another control signal input to the vector modulator circuit. Each control signal is applied to a corresponding variable attenuator forming part of the vector modulator circuit.

The message error signal received on line 36 is applied through a quadrature hybrid circuit having two outputs which are connected to respectively different electronically variable signal attenuators. The phase relationships are such that each attenuator operates on one quadrature component, only, of the message error signal. The outputs of those attenuators are then combined in a power combiner whose output is a vector error signal that is then fed to the amplifier 40.

In accordance with the present invention the quadrature control signals produced from the I & Q network are not directly applied to the vector modulator, but are first applied to bandwidth compensators. Thus the output of mixer 64 is applied to bandwidth compensator 100 and the output of mixer 66 is applied to bandwidth compensator 102. Each bandwidth compensator include circuit means within the negative feedback circuit for offsetting the DC levels of the quadrature control signals so as to detune performance of the error correction circuit from the test frequency, while improving the overall response of the amplifier system across the desired operating frequency band. In other words, the bandwidth compensators provide a means for detuning the control signals or correction signal relative to the frequency of the test signal.

FIG. 4 illustrates one circuit arrangement of the bandwidth compensators, in which an operational amplifier is interposed between each of the quadrature control signals and the associated input of the vector modulator, and a D. C. voltage is applied to the operational amplifier to adjust its reference voltage. While normally the reference voltage of each operational amplifier would be ground or zero, in accordance with the invention that reference level is adjusted, separately and differently for each of the quadrature control signals, if that is necessary, in order to achieve the desired end result. Thus, in bandwidth compensator 100 a D.C. offset voltage 104 is applied to the input 106 of operational amplifier 108 that does not receive the signal from mixer 64. It should also be noted that potentiometer 110 allows the offset voltage to be either positive or negative, and to be selected as to its magnitude. The same kind of D.C. offset voltage is applied to amplifier 109.

In the circuit of FIG. 4, if the signal is applied to the inverting input of the operational amplifier, then the D.C. offset is applied to the non-inverting input, or vice-versa.

FIG. 5 shows an alternate circuit arrangement in which the bandwidth compensators are again located between the corresponding mixers and the vector modulator. Mixer 64 drives compensator 112 and mixer 66 drives compensator 120, but the quadrature control signals are applied to the same inputs of the respective operational amplifiers to which the D.C. offset signals are applied. That is, in each side of the circuit a D. C. offset current is added to the D. C. current that represents the corresponding quadrature control signal. Specifically, in bandwidth compensator 112 an adjustable bias circuit 114 applies a voltage (and hence, current) to input 116 of operational amplifier 118 which also receives the associated quadrature control signals. If the quadrature control signal is applied to the inverting input of the operational amplifier, then the D.C. offset is also applied to the inverting input; or both may be applied to the non-inverting input.

OBTAINING IMPROVED BANDWIDTH RESPONSE

FIG. 2 is a set of hypothetical curves illustrating how effective an amplifier is in diminishing, reducing, or cancelling distortion signals or components thereof, as a function of signal frequency.

Curve "A" is a rather flat "Uncorrected Response" curve indicating that if the amplifier has no provision for cancelling distortion signals, then they will not be diminished or reduced at any point in the frequency spectrum.

Curve "B" indicates the typical response of an amplifier without the bandwidth compensation of the present invention, but using the conventional type of adaptive feedback control in which a test signal is compared with a residual portion of that test signal. This typically results in substantial distortion reduction at or near the test signal frequency. This curve "B" is also labelled "Corrected Response—No Bandwidth Compensation".

To appreciate the importance of the present invention it should be noted that loss in distortion cancellation occuring at frequencies other than the test signal frequency is never desirable. In wide-band telephony, such loss of distortion correction can be a particular disadvantage. One pertinent factor is that the Federal Communications Commission imposes mandatory operating standards.

Thus FIG. 2 shows a typical response curve in accordance with the present invention, and which is entitled "Corrected Response—Bandwidth Compensation". Here it is seen that signal cancellation at the test signal frequency is less pronounced, but at the same time the cancellation of distortion components by the amplifier system is relatively flat across the desired operating frequency band. The reduction in distortion frequency components is somewhat less at or near the test signal frequency, generally greater at other frequencies, and relatively uniform throughout the entire frequency band.

USE OF A MODULATED TEST SIGNAL

It is known in feed forward amplifiers to use a separate modulation signal that is superimposed upon the test signal itself. For telephony, a test signal in the 800 MHz range may have a superimposed modulation signal with a frequency of only 2 Khz. An example of that kind of circuit arrangement as applied to the present invention is shown in drawing FIG. 7.

The system of FIG. 7 is generally the same as that of FIG. 3, except that a test modulation signal source 130 has been added, together with appropriate circuitry for its use. Thus, the test modulation signal generator 130 feeds a mixer 135 which also receives the test signal from generator 50, producing a modulated test signal that contains one or more sidebands representing the modulation frequency. Mixer 135 feeds the modulated test signal through coupler 52 to the input of the main amplifier 14; therefore, at the outputs 21 and 22 the signal "TS" in FIG. 7 now actually represents a residual portion of the modulated test signal.

Mixers 64 and 66 now respond to the comparison of a sample of the original test signal with the residual modulated test signal derived from the final output circuit 22. As before, the mixers produce a D.C. component that is generally proportional to the amplitude of the residual portion of the original test signal. As before, the mixers also yield random high frequency components that are related to or a result of the distortion products from the main amplifier. Those high frequency components, as before, are filtered out in low-pass filters through which the output signals from the mixers 64, 66, pass.

In addition, however, there will also be present at the mixers 64, 66, whatever frequency components are caused by the residual portion of the modulation signal that is superimposed upon the test signal as a carrier.

The low-frequency modulation signal from generator 130 is applied directly to bandwidth demodulators 140 and 145. A residual modulation signal, substantially linearly related to the amplitude of the residual modulated test signal at 22, is also applied to the demodulators through the mixers 64, 66. However, a blocking capacitor 142 blocks the flow of direct current from mixer 64 to demodulator 140, and similarly a blocking capacitor 147 blocks the flow of direct current from mixer 66 to demodulator 145. Thus, the bandwidth demodulators must deal only with the modulation signal as a meaningful signal. The output of the demodulators is a D.C. component proportional to the residual modulation signal.

As explained in conjunction with FIGS. 4 through 6, in accordance with the invention, D.C. offset signals are inserted into the circuit paths between the mixers 64, 66, and the vector modulator 38. As before, the magnitudes of the offsets, whether positive or negative, may be adjusted to provide a uniform response of the amplifier throughout the desired operating frequency band. The offset signal may be applied either to the demodulator itself or to an operational amplifier that may be placed between the demodulator and the vector modulator or other circuit means for correcting the vector components of the message error signal.

The presently preferred embodiment of the invention has been described in considerable detail in order to comply with the patent laws. However, the scope of the invention is to be determined only in accordance with the appended claims.

What I claim is:

1. In a feed forward amplifier circuit which includes a main amplifier, an error correction circuit producing a message error signal, an error amplifier for producing an amplified message error signal that is then subtracted from the amplified and distorted message signal output of the main amplifier prior to a final output circuit, and a negative feedback circuit coupled to the final output circuit responsive to a test signal for compensating and minimizing variation or drift in the operation of the error amplifier, the improvement comprising a means associated with the negative feedback circuit for detuning performance of the error correction circuit at the test frequency so as to improve the overall circuit performance across a desired operating frequency band while diminishing its performance at the test signal frequency.

2. A feed forward amplifier circuit as in claim 1 which includes a means for generating a test signal whose frequency lies outside the desired bandwidth.

3. In a feed forward amplifier circuit which includes a main amplifier, an error correction circuit producing a message error signal, an error amplifier for producing an amplified message error signal that is then subtracted from the amplified and distorted message signal output of the main amplifier prior to a final output circuit, and a negative feedback circuit coupled to the final output circuit responsive to a test signal for compensating and minimizing variation or drift in the operation of the error amplifier, the improvement comprising:

a means associated with the negative feedback circuit for detuning performance of the error correction circuit at the test frequency so as to improve the overall circuit performance across a desired operating frequency band while diminishing its performance at the test signal frequency;

circuit means in the negative feedback circuit responsive to a comparison of the test signal and a residual test signal that is derived from the final output circuit for producing quadrature control signals;

the means for detuning comprising a means for offsetting the DC levels of the quadrature control signals; and the error correction circuit comprising:

a circuit means for breaking the message error signal into quadrature vector components;

means responsive to the offset quadrature control signals for dynamically and independently controlling the amplitudes of the quadrature vector components of the error signal; and circuit means for combining the quadrature vector components of the error signal into a single voltage vector error signal which is then supplied to the error amplifier.

4. A feed forward amplifier circuit as in claim 3 wherein the offsetting means includes a DC signal applied to an input of an operational amplifier.

5. A feed forward amplifier system having input and final output circuits, and comprising:
- a main amplifier;
- an error detection circuit for producing a message error signal that is broken into quadrature vector components;
- circuit means for combining the quadrature vector components of the error signal into a single voltage vector error signal;
- an error amplifier responsive to the vector error signal for producing an amplified message error signal that is then subtracted from the amplified and distorted message signal output of the main amplifier prior to the final output circuit;
- a negative feedback circuit coupled to the final output circuit, including circuit means responsive to a comparison of a test signal with a residual test signal portion derived from the final output circuit, for producing quadrature control signals;
- means within the negative feedback circuit for offsetting the DC levels of the quadrature control signals so as to detune performance of the error correction circuit at the test frequency; and
- circuit means responsive to the offset quadrature control signals for dynamically and independently controlling the amplitudes of the vector components of the error signal so as to compensate and minimize variation or drift in the operation of the amplifier circuit, thereby improving the overall performance of the amplifier across a desired operating frequency band.

6. A feed forward amplifier system as in claim 5 which includes a means for generating a test signal whose frequency lies outside the desired operating frequency band.

7. A feed forward amplifier system as in claim 5 wherein the offsetting means includes a DC signal applied to an input of an operational amplifier.

8. A feed forward amplifier system as in claim 7 which includes a means for generating a test signal whose frequency lies outside the desired operating frequency band.

9. In a communication circuit adapted to process signals over a wide frequency performance band, having a distortion signal resident in the circuit that has a known frequency component lying within the frequency band, and cancellation means at a known location within the circuit capable of providing essentially full cancellation of that distortion signal, the improvement comprising:
- circuit means detuning said cancellation means so that the cancellation of the distortion signal of said known frequency component is less than the maximum obtainable but the fidelity of response of the circuit across its entire performance band is more nearly uniform.

10. In a communication apparatus adapted to process signals over a wide frequency performance band, having a distortion signal resident in the circuit that has a known frequency component, and cancellation means at a known location in the apparatus capable of providing essentially full cancellation of that distortion signal frequency component, the improvement comprising:
- means associated with said cancellation means for detuning its operation so that the cancellation of the distortion signal frequency component is always less than the maximum obtainable, but the fidelity of response of the apparatus across its entire performance band is not only more nearly uniform, but remains so when the effective values of circuit components change as a function of temperature, time, or other factors.

11. A method, utilizing a test signal, for processing message signals and removing induced distortions, the method comprising the steps of:
- a) combining a message signal and a test signal thereby creating a combined signal having a test signal portion;
- b) processing the combined signal thereby creating distortions;
- c) partially cancelling the test signal portion of the processed signal using a feedforward circuit thereby creating a residual test signal;
- d) generating dynamic control signals responsive to the residual test signal;
- e) generating a distortion correction signal responsive to the control signals, the distortion correction signal being such that when combined with the processed message signal it cancels essentially all the distortions; and
- f) adjusting the distortion correction signal so as to increase cancellation of the distortions over the message signal bandwidth while decreasing cancellation at the test signal frequency.

12. The method of claim 11 wherein the distortion correction signal is adjusted by compensating the control signals.

13. The method of claim 12 wherein compensating the control signals includes off setting the control signals by applying a DC bias.

14. The method of claim 11 wherein generating the distortion correction signal further comprises the steps of:
- a) creating a message error signal representative of the distortions;
- b) attenuating the vector components of the message error signal in response to the control signals; and
- c) amplifying the attenuated message error signal so as to produce the distortion correction signal.

15. The method of claim 11 wherein the step of processing the combined message and test signal further comprises amplifying the combined message and test signal.

16. The method of claim 11 wherein the test signal is a pilot test signal at other than the message signal frequency.

17. The method of claim 11 further comprising the steps of:
- a) sampling the test signal portion of the processed test signal;
- b) adjusting and amplifying the sample so that when combined with the test signal portion of the processed test signal, the adjusted and amplified sample will essentially cancel the processed test signal; and
- d) combining the adjusted and amplified sample with the test signal portion of the processed test signal to create the residual test signal.

18. The method of claim 17 further comprising the steps of:
- a) sampling the residual test signal; and
- b) comparing the sampled residual test signal to the test signal to generate the dynamic control signals.

19. The method of claim 18 further comprising the step of compensating the sampled residual test signal-to-test signal comparison so as to increase cancellation of the undesired distortions over the message signal bandwidth.

20. The method of claim 11 further comprising the steps of:
- a) sampling the residual test signal; and
- b) comparing the sampled residual test signal to the test signal to generate the dynamic control signals.

21. A method, utilizing a test signal, for removing induced message signal distortions in a feed forward amplifier circuit, the method comprising the steps of:
   a) generating a message error signal representative of amplifier induced distortions;
   b) generating dynamic control signals responsive to a test signal;
   c) adjusting the message error signal in response to the control signals such that the adjusted message error signal is capable of cancelling essentially all induced distortions; and
   d) compensating the message error signal so as to increase the cancellation of the induced distortions across the operating frequency while decreasing cancellation at the test signal frequency.

22. The method of claim 21 wherein the message signal has a operating frequency and wherein the control signals are responsive to a pilot test signal that lies outside the message signal frequency.

23. The method of claim 22 wherein the step of adjusting the message error signal comprises:
   a) attenuating the vector components of the message error signal;
   b) combining the attenuated vector components; and
   c) amplifying the combined vector components.

24. The method of claim 22 wherein the control signals are generated using an I & Q network.

25. A method of signal processing comprising the steps of:
   combining a test signal of known frequency with a message signal to provide a composite original signal;
   processing the composite original signal through a circuit that introduces distortion therein;
   sampling the thus distorted signal;
   in a first comparison step, comparing the sample with the message signal;
   in response to the first comparison, creating an error signal and combining it with the distorted composite signal to provide an essentially undistorted message signal;
   in a second comparison step, comparing the essentially undistorted message signal with the test signal to produce a correction signal for modifying the error signal; and
   modifying the correction signal to detune the modified error signal relative to the test signal frequency.

26. The method of claim 25 wherein modifying the correction signal includes off setting the control signals by applying a DC bias.

27. The method of claim 25 wherein the step of processing the composite signal includes amplifying the composite signal.

28. The method of claim 25 wherein the test signal is a pilot test signal at other than the message signal frequency.

29. The method of claim 25 wherein the step of creating an error signal further comprises the steps of:
   a) in response to the first comparison, adjusting the vector components of the first comparison results; and
   b) amplifying the adjusted first comparison results to create the error signal.

30. The method of claim 25 wherein the correction signal is generated using an I & Q network.

31. An improved feed forward amplifier comprising:
   means for combining a test signal of known frequency with a message signal to provide a composite original signal;
   an amplifier circuit for amplifying the composite original signal so as to introduce distortion therein;
   means for sampling the thus amplified and distorted signal;
   first comparison means for comparing the sample with the message signal;
   means responsive to the first comparison for creating an error signal;
   means for combining the error signal with the distorted composite signal to provide an essentially undistorted message signal;
   second comparison means for comparing the essentially undistorted message signal with the test signal to produce a correction signal for modifying the error signal; and
   circuit means for detuning the correction signal relative to the frequency of the test signal.

32. The improved feed forward amplifier of claim 31 wherein the means for detuning the correction signal includes a DC bias for off setting the control signals.

33. The improved feed forward amplifier of claim 31 wherein the means for creating the error signal further comprises:
   a) a vector modulator for adjusting the vector components of the first comparison means output; and
   b) an amplifier for amplifying the vector modulator output to create the error signal.

34. The improved feed forward amplifier of claim 31 wherein the test signal is a pilot test signal at other than the message signal frequency.

35. The improved feed forward amplifier of claim 31 wherein the means for comparing the essentially undistorted message signal with the test signal to produce the correction signal further comprises an I & Q network.

* * * * *